United States Patent
De Cremoux et al.

(10) Patent No.: US 7,199,640 B2
(45) Date of Patent: Apr. 3, 2007

(54) BI-DIRECTIONAL DOUBLE NMOS SWITCH

(75) Inventors: Guillaume De Cremoux, Nijmegen (NL); Insun Van Loo, Nijmegen (NL); Jan Dikken, Nijmegen (NL); Ferry Nieuwhoff, Nijmegen (NL); Yovgos Christoforou, Nijmegen (NL); Aykut Kenc, Nijmegen (NL); Wilhelmus Johannes Remigius Willemsen, Nijmegen (NL)

(73) Assignee: DXP B.V., Eindhoven (NL)

( * ) Notice: Subject to any disclaimer, the term of this patent is extended or adjusted under 35 U.S.C. 154(b) by 24 days.

(21) Appl. No.: 10/532,922

(22) PCT Filed: Sep. 22, 2003

(86) PCT No.: PCT/IB03/04234

§ 371 (c)(1),
(2), (4) Date: Apr. 27, 2005

(87) PCT Pub. No.: WO2004/040761

PCT Pub. Date: May 13, 2004

(65) Prior Publication Data

US 2006/0043499 A1 Mar. 2, 2006

(30) Foreign Application Priority Data

Oct. 29, 2002 (EP) .................................. 02079526

(51) Int. Cl.
*H03K 17/687* (2006.01)
(52) U.S. Cl. ...................... 327/427; 327/365
(58) Field of Classification Search ...................... None
See application file for complete search history.

(56) References Cited

U.S. PATENT DOCUMENTS

| | | | | | |
|---|---|---|---|---|---|
| 5,705,911 | A | * | 1/1998 | Tamai | 320/134 |
| 5,783,322 | A | * | 7/1998 | Nagai et al. | 429/7 |
| 5,789,900 | A | * | 8/1998 | Hasegawa et al. | 320/132 |
| 5,883,495 | A | * | 3/1999 | Smith et al. | 320/128 |
| 5,939,908 | A | * | 8/1999 | Moore et al. | 327/108 |
| 6,548,916 | B1 | * | 4/2003 | Kanazawa et al. | 307/85 |
| 6,683,393 | B2 | * | 1/2004 | Lewis | 307/132 E |
| 7,030,591 | B2 | * | 4/2006 | Stellberger | 320/134 |

FOREIGN PATENT DOCUMENTS

| | | |
|---|---|---|
| EP | 0362080 A1 | 4/1990 |
| EP | 1091490 A2 | 9/2000 |
| EP | 1079525 A1 | 2/2001 |
| JP | 1119572 | 7/1999 |

* cited by examiner

Primary Examiner—Timothy P. Callahan
Assistant Examiner—Cassandra Cox
(74) Attorney, Agent, or Firm—Peter Zawilski

(57) ABSTRACT

A semiconductor switch comprises two NMOS transistors coupled in an anti-series arrangement, and a gate control circuit coupled to both gates of the NMOS transistors. Both drains of the NMOS transistors are interconnected, and the gate control circuit is coupled to the drains interconnection. The required chip area is halved compared to prior art switches. Pumping the gates to higher voltages may cause a further reduction of the sizes of the NMOS transistors. In addition, advantageously, a large range of input and output voltages can be allowed between the sources of the NMOS transistors, whereby the sources act as input and output respectively of the switch, thus allowing application of the switch in a broad technical field.

8 Claims, 2 Drawing Sheets

BI-DIRECTIONAL DOUBLE NMOS SWITCH

The present invention relates to a semiconductor switch comprising two MOS transistors coupled in an anti-series arrangement, and a gate control circuit coupled to both gates of the MOS transistors.

The present invention also relates to a system comprising two electrical circuits interconnected by the semiconductor switch. This application is a 371 of PCT/IB03/04234 filed on Sep. 22, 2003.

Such a semiconductor switch is known from JP-11195972. The known semiconductor switch comprises two Metal Oxide Semiconductor (MOS) transistors, embodied by P-channel MOS Field Effect Transistors (FET), which are coupled in an anti-series arrangement, whereby the sources of both of these shortly called PMOS transistors are interconnected. The semiconductor switch also comprises a gate control circuit coupled to both gates of the PMOS transistors, which gate control circuit is a gate-source control circuit which is also coupled to the interconnection of the sources. The gate-source control circuit comprises a discharge circuit for discharging electric charges between the gates and sources of the PMOS transistors by allowing inverted control signals to control their respective impedance. This reduces the time for a change in impedance between drain and source of the semiconductor switch. The discharge circuit comprises a resistor, which may need to consume a substantial amount of power requiring a relatively large chip area.

It is a disadvantage of the known semiconductor switch that it requires a comparatively large chip and chip die area.

It is an object of the present invention to provide a bi-directional integrated switch having wide application capabilities, showing an improved conductivity, yet requiring a reduced chip and die area.

Thereto the semiconductor switch according to the invention is characterized in that the MOS transistors are embodied by N-channel MOS transistors, whereof both drains are interconnected, and that the gate control circuit is coupled to the drains interconnection.

It is an advantage of the semiconductor switch according to the present invention that the inventors found that the proposed semiconductor switch topology offers a chip area and chip die size reduction of a factor two. Despite the reduced chip area the conductivity properties of the switch controlled by the gate control circuit acting as a charge pump, were found to be very good. In practice the switch topology is such that the higher the charge pump output voltage at the respective gates of the NMOS transistors is the better the conductivity of the switch as a whole gets. Therefore pumping these gates to higher voltages causes a further reduction of the sizes of the NMOS transistors without a risk of destruction. In addition advantageously a large range of input and output voltages can be allowed between the sources of the NMOS transistors, whereby the sources act as input and output respectively of the switch, thus allowing application of the switch in a wide technical area Also no large sized power consuming resistors requiring a large chip area are needed in the switch according to the invention.

An embodiment of the semiconductor switch according to the invention is characterized in that semiconductor switch comprises a voltage limiting circuit coupled between the gate and the source of at least one of the transistors.

A very high voltage in the order of several tens of volts at the source of one of the NMOS transistors which could pose the transistors integrity at risk is no longer a threat since the voltage limiting circuit coupled between the gate and the source of at least one of the transistors charges the respective gate to almost the same voltage as the source.

In a further embodiment the semiconductor switch according to the invention is characterized in that the voltage limiting circuit comprises a semiconductor means, preferably a transistor, such as an NMOS transistor or a diode. Implementation of these semiconductor means on a limited IC chip area can be accomplished very cost effective.

A still further embodiment of the semiconductor switch according to the invention is characterized in that the NMOS transistors are Double Diffused NMOS transistors.

Advantageously these so called DMOS transistors are capable of withstanding a medium voltage between source and gate, and even a high voltage between drain and gate without breaking down. This saves the taking of overvoltage protecting measures.

Another embodiment of the semiconductor switch according to the invention is characterized in that the gate control circuit is arranged for performing a two phase gate pumping voltage multiplication operation.

During a first phase of this two phase gate pumping operation a charge is built up, where after in a second phase this charge is added to a further charge to reveal an increased charging voltage to the gates of the NMOS transistors. This increased voltage in turn leads to a wanted high conductivity of the NMOS transistors.

In still another embodiment of the semiconductor switch according to the invention the gate control circuit preferably comprises a switched capacitor means. These means are easy to implement on a limited chip area and their charge delivery can be controlled in order to influence the startup time of the switch.

Yet another embodiment of the semiconductor switch according to the invention is characterized in that the two phase gate pumping voltage multiplication operation has a tunable charge pump frequency around 15–200 KHz, preferably around 50 KHz.

The startup time to charge the gate to an operational voltage can be influenced by tuning the charger pump frequency.

At present the semiconductor switch and system provided therewith, both according to the invention will be elucidated further together with their additional advantages while reference is being made to the appended drawing, wherein similar components are being referred to by means of the same reference numerals. In the drawing.

Figure 1:
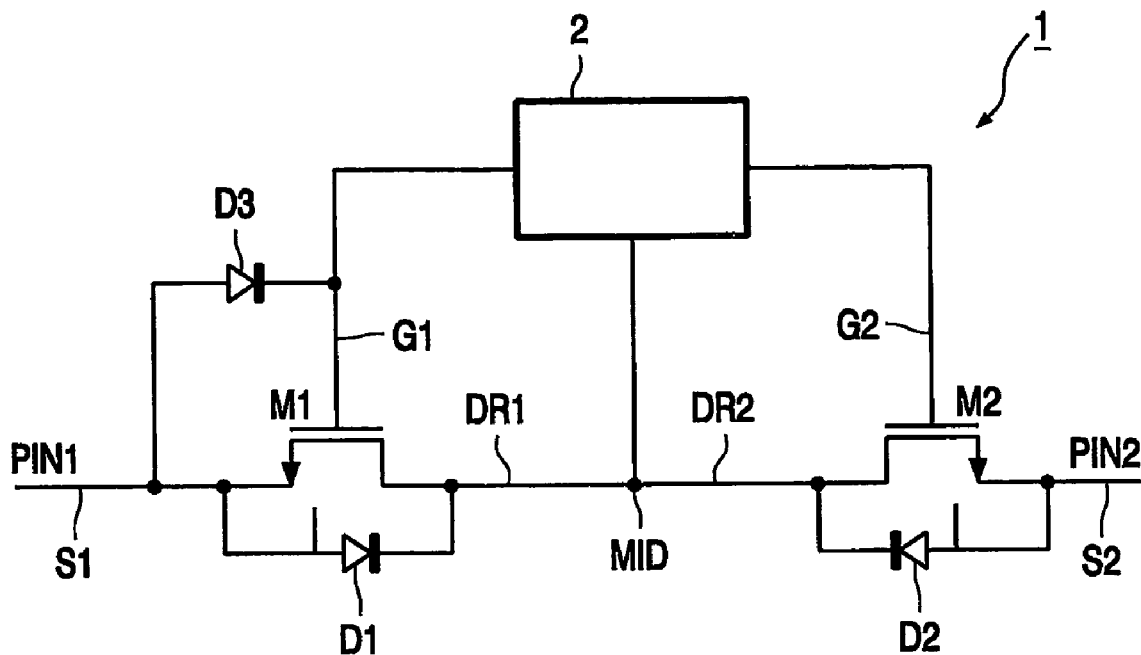
FIG. 1 shows a functional diagram of possible embodiments of the semiconductor switch according to the present invention.

FIG. 1 shows a functional diagram of a semiconductor switch 1 comprising two N-channel MOS transistors M1 and M2 coupled in an anti-series arrangement. In such an anti-series arrangement the two parasitic intrinsic body diodes D1 and D2 are connected in series with their polarities inverted. Each of the NMOS transistors M1 and M2 has a gate G1, G2, a source S1, S2 and a drain D1, D2 respectively. S1(PIN1) is the input, while S2(PIN2) is the output of the switch 1. The drains D1 and D2 are interconnected. The switch 1 also comprises a gate control circuit 2, which is coupled to both gates G1 and G2 of the respective transistors M1 and M2, and to the drains interconnection, indicated MID.

The operation of the switch 1, which acts as a bi-directional switch between the sources S1 and S2 is as follows. The gate control circuit 2, hereafter also called the charge pump 2 senses the MID voltage and derives gate voltages such as by means of voltage multiplication which are higher than both the input voltage and the output voltage on S1 and S2 respectively. This is accomplished by the presence and connection of the parasitic diodes D1 and D2. This ensures the ON-state of both transistors M1 and M2. In the OFF-state a low voltage is applied by the charge pump 2 to the gates G1, G2 and/or the drain connection MM, such as to effect a current blocking of the switch 1.

The switch 1 embodied by NMOS transistors M1 and M2 requires a total area which is half the amount of area needed by the prior art. Less than half thereof is required for additional circuitry, including the charge pump 2. The NMOS transistors may be Double Diffused NMOS transistors, also known as DMOS transistors. Such DMOS transistors are capable of withstanding a medium voltage between source and gate and a high voltage between drain and gate, thus not requiring the application of protective circuitry for the transistors M1 or M2.

In a further embodiment the semiconductor switch 1 comprises a voltage limiting circuit, shown in FIG. 1 as D3, here coupled between the gate G1 and the source S1 of the transistor M1. This way a high positive voltage applied at S1 in particular in the OFF-state of transistor M1 will not destroy M1, since the voltage on G1 will always be the limited voltage value lower than the voltage on input S1. In practice the voltage limiting circuit comprises a semiconductor means, such as a transistor, for example a NMOS transistor or a diode. In the latter case the differing voltage between source and gate will be one diode voltage drop, in the order of 0.6 to 0.8 Volt.

Figure 2:
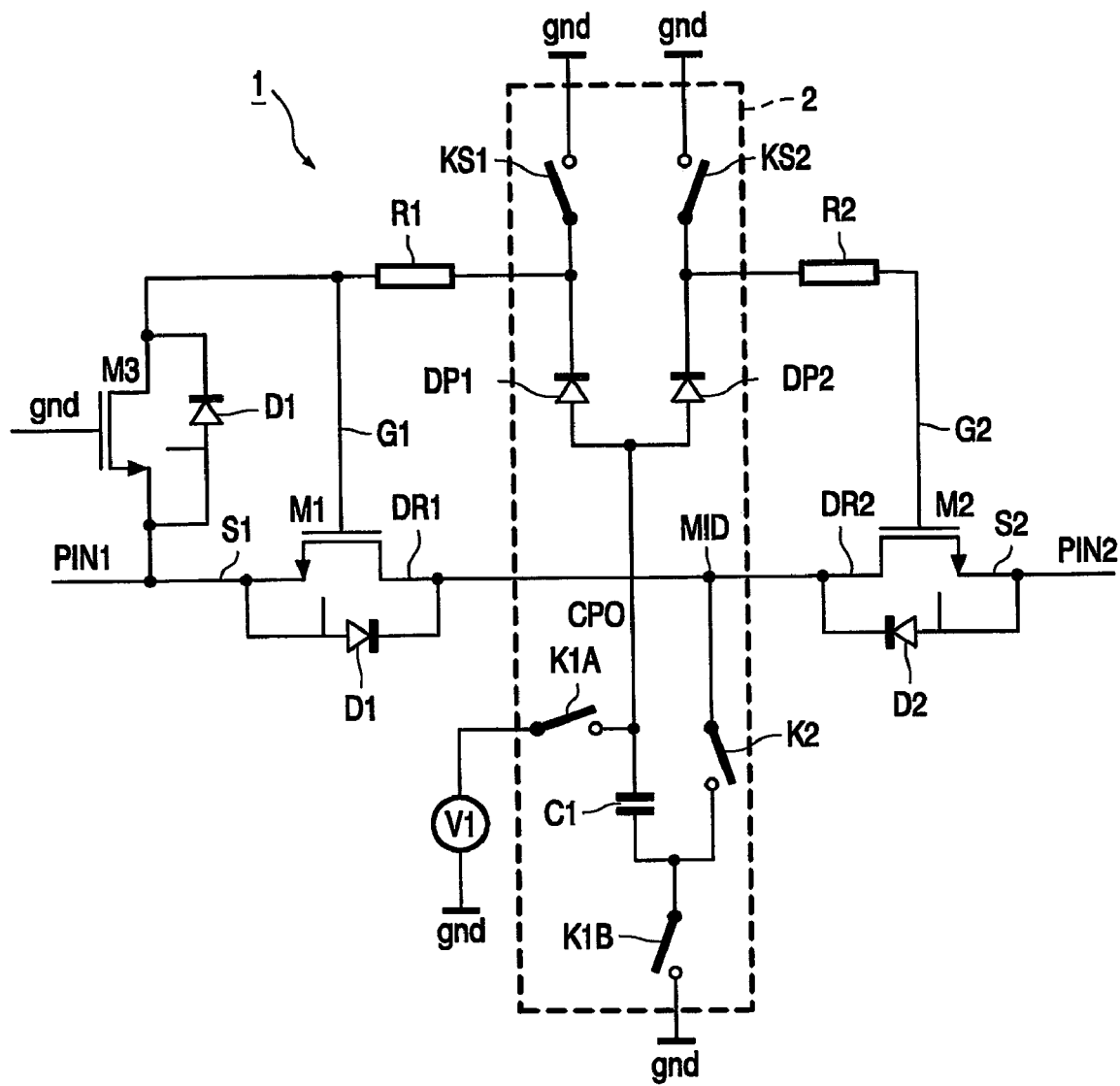
FIG. 2 shows a detailed operational diagram of the semiconductor switch of FIG. 1.

FIG. 2 shows a detailed operational diagram of the semiconductor switch 1. The voltage limiting circuit now is formed by NMOS M3, which may itself be protected against high voltages, such as by means of a zener diode (not shown). The charge pump is the part 2 which is shown in dashed lines. It comprises two semiconductors transitions DP1 and DP2 whose anodes are interconnected, and whose cathodes are connected to controllable switches KS1 and KS2 respectively, both coupled to earth GND. The switches KS1 and KS2 are also coupled to the respective gates G1 and G2 of M1 and M2 through current limiters R1 and R2 respectively. A series arrangement of controllable switches K2 and K1B is connected between MD and GND, and their connection point is coupled to one side of a capacitor means C1, whose other side indicated CPO is coupled to the common anodes of diodes DP1 and DP2. Between CPO and GND there is a series arrangement of a controllable switch K1A and a voltage source V1.

The operation of the semiconductor switch 1 of FIG. 2 is as follows. In the OFF-state KS1 and KS2 are closed, which means that G1 and G2 are pulled to earth, through R1 and R2 which may both be resistors. If at the one hand input S1 carries a very high voltage, then the parasitic diode in M3 will maintain gate G1 of M1 at Vsource 1−VM3, thus preventing a too high voltage between G1 and S1, as described above. In that case some current will flow through the diode in M3 and R1, but choosing R1 high enough will allow control of this low current. So no current will flow through M1. If at the other hand input S1 carries a negative voltage M3 will conduct because the gate source voltage is larger than 0 Volt. Then G1 is connected to S1 through M3 and the gate source voltage of M1 is 0 Volt, ensuring that again no current will flow through M1. Finally for a given voltage on source S2 of M2, any positive or negative voltage on S1 will result in absence of current drawn or sourced from S2 to S1. The topology of the switch 1 with respect to both the gates G1, G1 and the drains D1, D2 provides a more efficient Electrostatic Discharge (ESD) path requiring less ESD protection measures.

In the ON-state KS1 and KS2 are open. Now the gates G1 and G2 of M1 and M2 are charged in two phases. When K1A and K1B are closed capacitor means C1 is charged to voltage V1. V1 may be an internal voltage derived from for example the voltage on S1 or S2. Now K1A and K1B are opened and K2 is closed. The charge and polarity of C1 remain unchanged so replacing GND by MID pulls up CPO voltage to VMID+V1. This forms an surplus voltage which will inject through diodes DP1 and DP2 a charge to the gates G1 and G2 of M1 and M2 respectively. This two phase charging pump operation is repeated several times until G1 and G2 are actually charged to a final voltage VMID+V1−VDP1. This ensured that G1 and G2 are charged to a voltage which is higher than S1 or S2, because VMID has the highest value minus a semiconductor voltage drop. V1 is adjusted to obtain the highest voltage on G1 and G2 and to obtain the best conductivity for the smallest size of the bi-directional semiconductor switch 1. In practice the very efficient charge pump voltage multiplication operation has a tunable charge pump frequency around 15 to several hundreds KHz. In one embodiment the charge pump frequency was around 50 KHz. At 50 KHz about 50 cycles are needed to charge G1 and G2. The switch 1 is then fully activated in around 1 msec. This startup time is tunable by tuning either the charge pump frequency or the charge delivered by C1 at each clock cycle.

Figure 3:
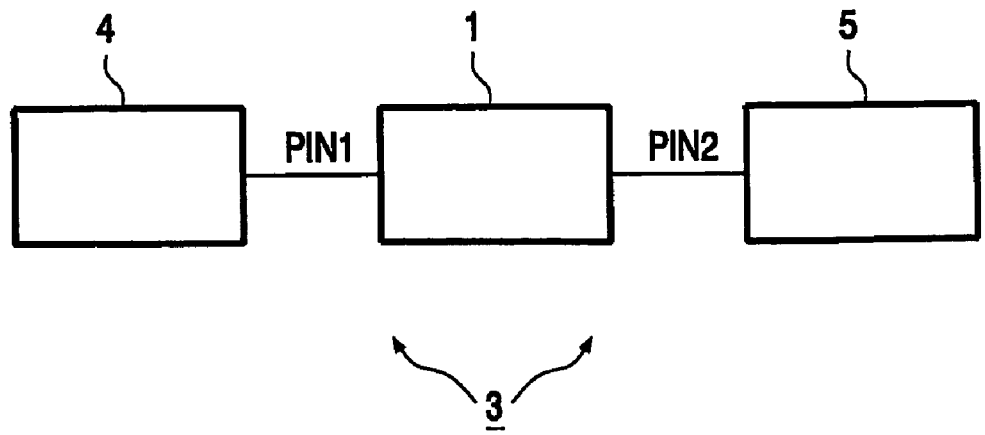
FIG. 3 shows an outline of a system provided with a semiconductor switch according to the invention.

FIG. 3 shows an outline of a system 3 provided with a semiconductor switch. The system 3 comprises a first electric circuit 4, here for example formed by a power supply, such as a wall plug adapter, and a second electric circuit 5 using that power, which for example be a battery of a telephone, such as a mobile phone. Both circuits 4 and 5 are isolated through the semiconductor switch 1 and current can be blocked or passed through the switch 1 in one or the other direction. The switch 1 is properly controlled in the OFF-state or the ON-state in a way as described herein above. Of course other electric circuits 4, 5 may be applied as the ones exemplified here. Generally the one circuit provides power and the other circuit uses this power or vise versa

The invention claimed is:

1. A semiconductor switch comprising:
   two MOS transistors that are coupled in an anti-series arrangement, and
   a gate control circuit that is coupled to both gates of the MOS transistors, the MOS transistors being embodied as N-channel MOS transistors, both drains of the MOS transistors being interconnected, and the gate control circuit being coupled to the interconnected drains;
   wherein the semiconductor switch further includes a voltage limiting circuit that is coupled between the gate and the source of at least one of the MOS transistors.

2. The semiconductor switch according to claim 1, wherein the voltage limiting circuit comprises a semiconductor means.

3. The semiconductor switch according to claim 2, wherein the semiconductor means is an NMOS transistor.

4. The semiconductor switch according to claim 1 wherein the gate control circuit is arranged to perform a two phase gate pumping voltage multiplication operation.

5. The semiconductor switch according to claim 4, wherein the gate control circuit comprises a switched capacitor means.

6. The semiconductor switch according to claim 4 or claim 5, wherein the two phase gate pumping voltage multiplication operation has a tunable charge pump frequency around 15–200 KHz.

7. A system comprising two electrical circuits, which system comprises a semiconductor switch according to claim 1, which semiconductor switch is interconnected between the two electrical circuits.

8. The semiconductor switch according to claim 4 or claim 5, wherein the two phase gate pumping voltage multiplication operation has a tunable charge pump frequency around 50 KHz.

\* \* \* \* \*